US012772877B2

(12) United States Patent
Geyik et al.

(10) Patent No.: US 12,772,877 B2
(45) Date of Patent: Oct. 20, 2026

(54) PACKAGING ARCHITECTURE WITH TRENCH VIA ROUTING FOR ON-PACKAGE HIGH-SPEED INTERCONNECTS

(71) Applicant: Intel Corporation, Santa Clara, CA (US)

(72) Inventors: Cemil Geyik, Gilbert, AZ (US); Kemal Aygun, Tempe, AZ (US); Zhiguo Qian, Chandler, AZ (US); Kristof Kuwawi Darmawikarta, Chandler, AZ (US); Zhichao Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 219 days.

(21) Appl. No.: 17/847,257

(22) Filed: Jun. 23, 2022

(65) Prior Publication Data

US 2023/0420377 A1 Dec. 28, 2023

(51) Int. Cl.

*H10W 70/05* (2026.01)
*H10W 70/60* (2026.01)
*H10W 70/65* (2026.01)
*H10W 90/00* (2026.01)
(Continued)

(52) U.S. Cl.

CPC ........... *H10W 70/65* (2026.01); *H10W 70/05* (2026.01); *H10W 70/611* (2026.01); *H10W 90/00* (2026.01); *H10W 90/401* (2026.01); *H10W 90/701* (2026.01); *H10W 70/685* (2026.01); *H10W 74/15* (2026.01);
(Continued)

(58) Field of Classification Search

CPC ............. H01L 23/5386; H01L 21/4857; H01L 23/49816; H01L 23/49838; H01L 23/5385; H01L 24/16; H01L 25/0652; H01L 25/0655; H01L 23/49822; H01L 24/32; H01L 24/73; H01L 2224/16148; H01L 2224/16227; H01L 2224/16238; H01L 2224/32225; H01L 2224/73204; H01L 2924/1431; H01L 2924/1434; H01L 2924/3025; H01L 2924/3512; H01L 2924/3841; H01L 23/50; H01L 23/552; H01L 23/66; H01L 2223/6627; H01L 2223/6638; H01L 2224/81

See application file for complete search history.

(56) References Cited

U.S. PATENT DOCUMENTS

2021/0028123 A1 * 1/2021 Dhakal ................ H01L 23/552

* cited by examiner

*Primary Examiner* — Elias Ullah
(74) *Attorney, Agent, or Firm* — Akona IP PC

(57) ABSTRACT

Embodiments of a microelectronic assembly comprise: a package substrate comprising a conductive trace in a dielectric material, the conductive trace surrounded by a conductive structure coupled to a ground connection, the package substrate further comprising metallization layers alternating with dielectric layers of the dielectric material; and an integrated circuit (IC) die coupled to a surface of the package substrate, the IC die being coupled to the conductive trace by a conductive pathway. The dielectric layers and the metallization layers are parallel to the surface of the package substrate, the conductive trace comprises a trench via in one of the dielectric layers, and the conductive structure comprises grounded plates extending across a length and width of the package substrate in metallization layers on either side of the dielectric layer.

20 Claims, 8 Drawing Sheets

(51) Int. Cl.
*H10W 70/685* (2026.01)
*H10W 74/15* (2026.01)

(52) U.S. Cl.
CPC ........ *H10W 90/722* (2026.01); *H10W 90/724* (2026.01); *H10W 90/734* (2026.01)

PACKAGING ARCHITECTURE WITH TRENCH VIA ROUTING FOR ON-PACKAGE HIGH-SPEED INTERCONNECTS

TECHNICAL FIELD

The present disclosure relates to techniques, methods, and apparatus directed to a packaging architecture with trench via routing for on-package high-speed interconnects.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

OVERVIEW

Figure 1A:
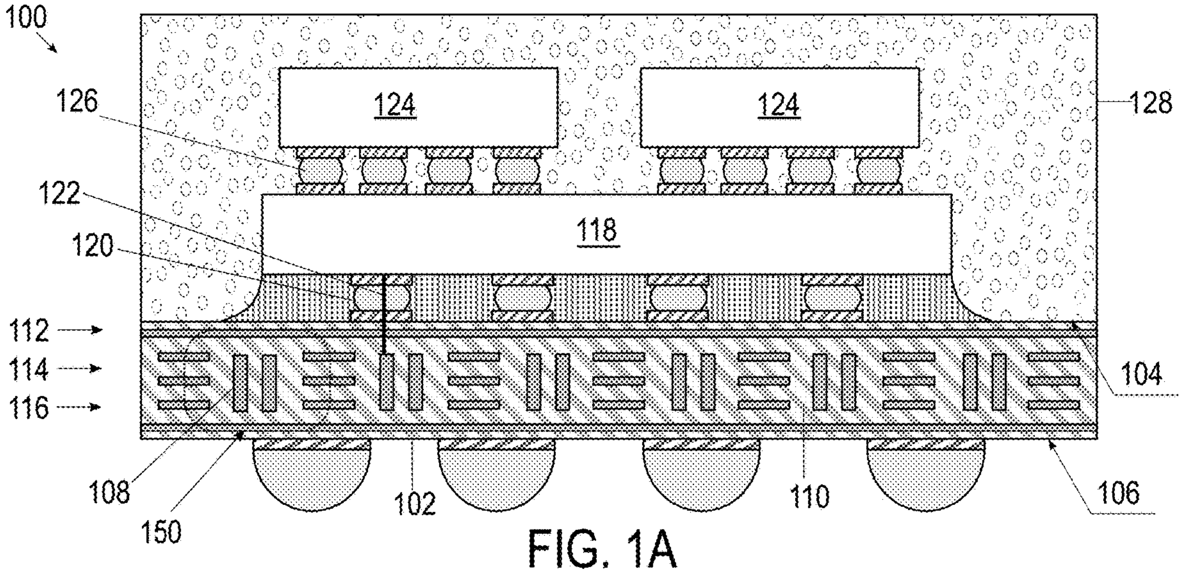
FIG. 1A is a schematic cross-sectional view of an example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

The trend in the computer industry is to utilize multiple processors in large servers, the multiple processors being coupled together in a single package, such as a Multi-Chip Module (MCM). The multiple processors along with other IC dies containing memory circuits (e.g., cache memory circuits, high-bandwidth memory circuits, etc.) are interconnected by high-speed data buses in the package substrate of the MCM, for example, to enable the totality of processors to operate together. Copper interconnect technology is typically used to fabricate these high-speed data buses, but the technology is inherently limited in its ability to scale to the bandwidth/distance requirements of next generation servers. These limitations are primarily associated with signal loss and distortion in the electrical transport media and bandwidth reduction due to skin effect at high data transmission rates.

Further, demand for higher data rate is driving signal speeds in ICs to values greater than 10 GHz. Signals having speeds greater than 10 GHz are considered as high-speed signals. Achieving such high speeds is a challenge in typical package substrates, which are composed of layers of dielectric material with conductive traces between the layers and conductive vias through the layers. In such structures, high-speed signals propagating through the conductive traces and vias experience loss dependent on the dielectric constant of the dielectric material, and the geometry (e.g., width, length, thickness, shape, etc.) of the conductive traces.

As the demand for higher data rates continues to increase, losses in package substrates increase proportionately unless minimized using non-conventional techniques. In a general sense, signal loss in the forms of insertion loss (simply referred to as "loss" herein) in package substrates, has two major components, considering that radiation loss is negligible in high-speed interconnects: i) dielectric loss, and ii) conductor loss (i.e., loss due to the dielectric surrounding the signal conductor, also called "conductor trace," "trace," or "transmission line" interchangeably herein, and loss due to the transmission line itself). Dielectric loss is independent of the topology and depends only on the dielectric materials. It is proportional to the dissipation factor (Df) of the dielectric material, root of dielectric constant (Dk) of the dielectric material and frequency of the high-speed signals. Thus, one approach to facilitate lower loss is to use dielectric materials with lower Dk. To this end, introduction of new dielectrics and adhesion promotion techniques have been key enablers as technology building blocks for lower loss and higher bandwidth. Material suppliers have been continuously improving their processes and chemistries to reduce the dielectric constant, dissipation factor (e.g., loss tangent) and surface roughness, while providing strong adhesion to the dielectric materials.

Conductor loss can be split into two factors: i) surface roughness induced loss, and ii) bulk conductor loss. Unlike dielectric loss, conductor loss depends on the design rules, shape, and dimensions of the transmission line conducting the high-speed signals. Thus, today's on-package high-speed interconnect loss is largely dominated by bulk conductor loss due to shrinking cross-sectional dimensions (e.g., thinner substrates, small traces, etc.). This dominant factor can be reduced by optimizing transmission line designs for a low-resistance conductor. Fundamentally, larger trace dimensions lead to lower resistance. However, using wider traces without other layout changes may not provide the desired improvement in mitigating insertion loss in package substrates. For example, a wider trace results in impedance shift if the surrounding dielectric stack-up (e.g., number of layers) and materials remain the same. Therefore, to be able to use large traces with the same stack-up, materials, and target impedance, "skip layer" architecture is typically utilized. For the same impedance target, large traces could be used with thicker dielectrics either locally by a "skip layer" which is a region in the dielectric above or below a high-speed transmission line where other metal traces are absent). Skip layer locally increases the effective dielectric thickness by voiding (i.e., skipping) metal layers above and/or below signal traces. This improves loss performance, but one of the major downsides of the skip layer architecture is routing density reduction per layer. For example, to reduce loss, multiple metal layers can be skipped on either side of the traces, but this leads to reduction in routing density due to the lack of metal in certain dielectric layers.

Typically, pitch between differential pair of transmission lines is reduced to fit high-speed lanes given the package form factor and layer count. If this results in exceeding the loss budget, then better buildup material and roughening processes can be used if available, or else, form factor may be increased, product features (such as number of lanes, number of high-speed input/outputs (IOs), etc.) may be downgraded (e.g., reduced) or other known techniques utilized. However, in general, pitch between differential pair of transmission lines is reduced at the expense of loss. Better material and process options are expensive, and better alternatives may not be available if the best material and process are being used. Form factor increase adds cost, and downgrading features leads to deterioration in competitiveness.

Accordingly, embodiments of a microelectronic assembly comprise: a package substrate comprising a conductive trace in a dielectric material, the conductive trace surrounded by a conductive structure coupled to a ground connection, the package substrate further comprising metallization layers alternating with dielectric layers of the dielectric material; and an IC die coupled to a surface of the package substrate, the IC die being coupled to the conductive trace by a conductive pathway. The dielectric layers and the metallization layers are parallel to the surface of the package substrate, the conductive trace comprises a trench via in one of the dielectric layers, and the conductive structure comprises grounded plates extending across a length and width of the package substrate in metallization layers on either side of the dielectric layer.

In some embodiments, trench vias are aligned with underlying traces, not for vertical access but to increase routing density of skip layer architecture without sacrificing loss. Embodiments of the microelectronic assembly described herein provide higher routing density for skip layer architecture and superior loss performance for asymmetric implementations. Various embodiments may increase routing density of skip layer architecture without sacrificing loss. In some embodiments, this may be achieved by patterning perfectly aligned vias, for example, zero misalignment vias (ZMV) and/or self-aligned vias (SAV) over underlying traces along an entire length of the conductive trace (also referred to interchangeably herein as "transmission line"). Thicker traces require smaller width for the same impedance. Although this seems counterintuitive at first glance, such a structure yields a slower rate of change on loss-pitch characteristic curve of differential pairs, hence providing a valuable tradeoff. Various embodiments can reduce pitch between transmission lines for certain loss values, and reduce loss for certain pitch values considering symmetric skip layer as a baseline. In embodiments including asymmetric skip layers, loss improvement as well as pitch reduction may be realized.

Note that any loss analysis presented herein utilizing an example of a single-ended stripline for the transmission line may be applicable to differential pairs as well, with similar analysis results and techniques.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type or P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides, including optical fiber, optical splitters, optical combiners, optical couplers, and optical vias.

The term “waveguide” refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term “conductive trace” may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term “conductive via” may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term “package substrate” may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term “metallization stack” may be used to refer to a stack of one or more interconnects for providing connectivity to different circuit components of an IC die/chip and/or a package substrate.

As used herein, the term “pitch” of interconnects refers to a center-to-center distance between adjacent interconnects.

In context of a stack of dies coupled to one another or in context of a die coupled to a package substrate, the term “interconnect” may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example,"an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112*a*-112*e*), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

EXAMPLE EMBODIMENTS

FIG. 1A is a schematic cross-sectional view of an example microelectronic assembly 100 according to some embodiments of the present disclosure. Microelectronic assembly 100 comprises, in the embodiment shown, a package substrate 102 having a first surface 104 and an opposing second surface 106. Package substrate 102 comprises one or more conductive trace 108 in a dielectric material 110. In specific embodiments, conductive trace 108 is configured to conduct electrical signals having speeds greater than 10 GHz, and as such, conductive trace 108 may be considered a high-speed interconnect. Conductive trace 108 is surrounded by an electromagnetic shield 112 coupled to a ground connection (not shown). In various embodiments, conductive trace 108 is parallel to surfaces 104 and 106. Conductive trace 108, dielectric material 110, and electromagnetic shield 112 are arranged in metallization layers 114 comprising conductive material (e.g., metals, such as copper), alternating with dielectric layers 116 of dielectric material 110. Metallization layers 114 and dielectric layers 116 are parallel to surfaces 104 and 106 of package substrate 102. Microelectronic assembly 100 further comprises one or more IC die 118 coupled to surface 104 of package substrate 102 by DTPS interconnects 120. In various embodiments, IC die 118 may be coupled to at least one conductive trace 108 by a conductive pathway 122. Conductive pathway 122 may comprise conductive vias and metal traces not shown in the figure merely for ease of illustration and so as not to clutter the drawing.

Figure 1B:
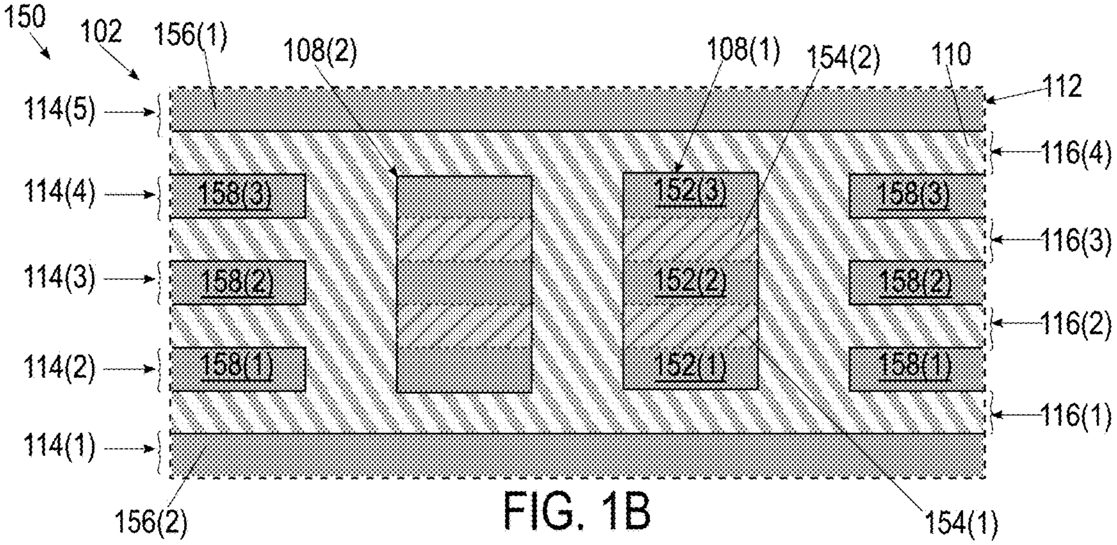
FIG. 1B is a schematic cross-sectional view of a portion of the example microelectronic assembly of FIG. 1A according to an embodiment of the present disclosure.

A cross-section of portion 150 of package substrate 102 is shown in greater detail in FIG. 1B. In the particular embodiment shown in FIG. 1B, there are two mutually parallel conductive traces 108(1) and 108(2). In various embodiments, conductive traces 108(1) and 108(2) may form a differential pair for conducting high-speed signals having a frequency above 10 GHz. Conductive trace 108 comprises one or more metal plate 152 in one or more of metallization layer 114 and one or more trench via 154 in one or more of dielectric layer 116. For example, in the embodiment shown in the figure, package substrate 102 comprises metallization layers 114(1)-114(5) and dielectric layers 116(1)-116(4). Conductive trace 108(1) comprises metal plates 152(1)-152(3) disposed respectively in metallization layers 114(2)-114(4) and trench vias 154(1)-154(2) disposed respectively in dielectric layers 116(2)-116(3). These numbers of metallization layers 114 and dielectric layers 116 are merely for example purposes and are not to be construed as limitations. Conductive trace 108 may be disposed in any number of metallization layers 114 and dielectric layers 116 within the broad scope of the embodiments. In a general sense, conductive trace 108 comprises a plurality of parallel metal plates 152 in adjacent metallization layers 114 and trench vias 154 in dielectric layers 116 between adjacent metallization layers 114, trench vias 154 being in continuous contact with metal plates 154 along a length of conductive trace 108. In various embodiments, metal plates 152(1)-152(3) may have the same or similar width as each other, as also trench vias 154(1) and 154(2).

In various embodiments, electromagnetic shield 112 may comprise grounded plates 156 (e.g., 156(1), 156(2)) in some metallization layers 114 (e.g., 114(1), 114(5)), and grounded traces 158 (e.g., 158(1)-158(3)) in other metallization layers 114 (e.g., 114(2)-114(4)) between grounded plates 156. Grounded plates 156 and grounded traces 158 are coupled to a ground connection (not shown). Grounded plates 156 extend across a length and width of package substrate 102 in respective metallization layers on either side of conductive trace 108 (with intermittent breakages for vias and other such structures that necessarily cut through grounded plates 156). In various embodiments, conductive trace 108 is sandwiched in dielectric material 110 between grounded plates 156(1) and 156(2) along one direction (e.g., a direction through a thickness of package substrate 102) and between grounded traces 158(1)-158(3) along an orthogonal direction (e.g., a direction through a length (or width) of package substrate 102). In the example orientation of the figure, conductive trace 108 is sandwiched vertically between ground plates 156 and sandwiched laterally between ground traces 158.

Figure 1C:
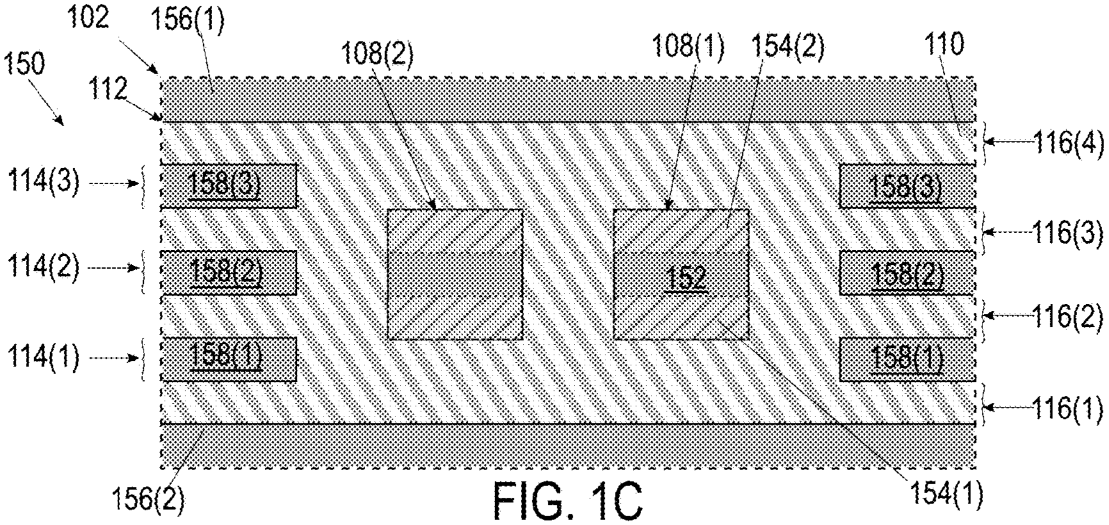
FIG. 1C is a schematic cross-sectional view of a portion of the example microelectronic assembly of FIG. 1A according to another embodiment of the present disclosure.

A cross-section of portion 150 of another embodiment of package substrate 102 is shown in greater detail in FIG. 1C. In the particular embodiment shown in FIG. 1C, there are two mutually parallel conductive traces 108(1) and 108(2). In various embodiments, conductive traces 108(1) and 108(2) may form a differential pair for conducting high-speed signals having a frequency above 10 GHz. Conductive trace 108 comprises one metal plate 152 in any one of metallization layers 114, for example, 114(1) and trench vias 154(1) and 154(2) on either side of metal plate 152, disposed respectively in dielectric layers 116(2)-116(3). The configuration of conductive trace 108 as shown has partially "floating" trench vias 154(1) and 154(2) that lack "pads" and "caps," i.e., metal plates 152 on sides of trench vias 154(1) and 154(2) proximate to respective ground plates 156(1) and 156(2). In some embodiments, metal plate 152 may also be absent to realize a fully "floating" trench via 154 (not shown in the figure) in a particular one of dielectric layers 116 without accompanying metal plates in any of metallization layers 114. Trench vias 154(1) and 154(2) may be in continuous contact with metal plate 152 along an entire length of conductive trace 108 in some embodiments. In various embodiments, trench vias 154(1) and 154(2) may have the same or similar width as metal plate 152.

Figure 2:
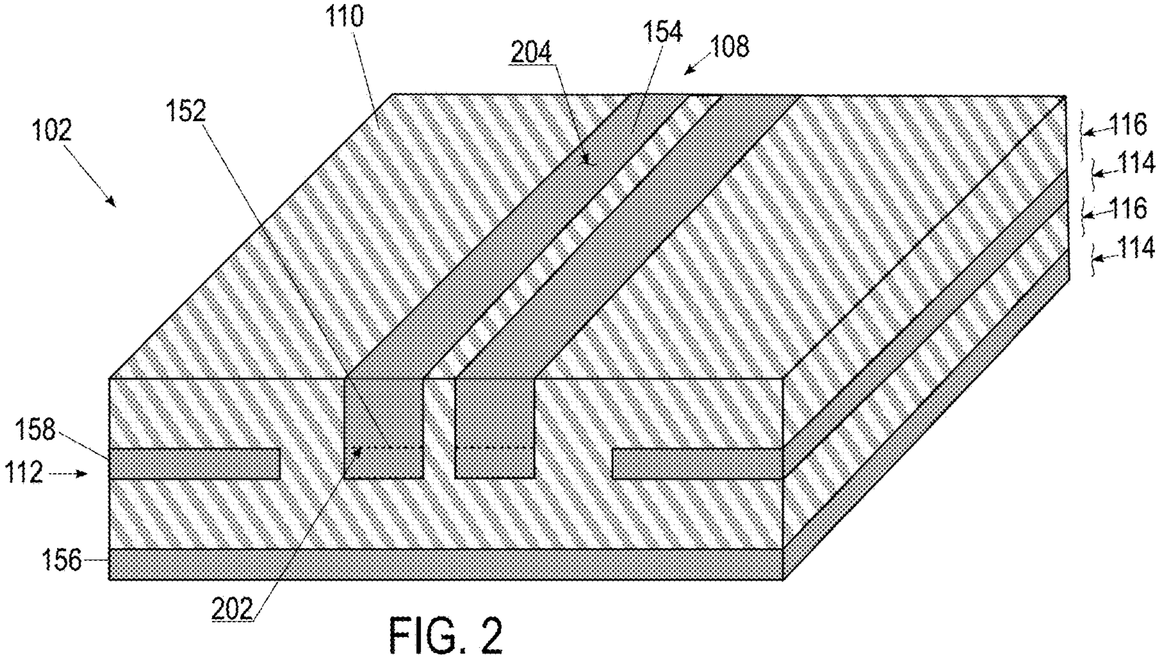
FIG. 2 is a simplified perspective view of a portion of an example microelectronic assembly according to embodiments of the present disclosure.

FIG. 2 is a simplified perspective view of a portion of an example microelectronic assembly 100 according to embodiments of the present disclosure. Conductive trace 108 comprises metal plate 152 in metallization layer 114 and trench via 154 in dielectric layer 116. Trench via 154 has a side 202 and an opposing side 204. Metal plate 152 is in continuous contact with trench via 154 on side 202 of trench via 154 along an entire length of conductive trace 108. Metal plate 152 may be sandwiched between ground traces 158 in metallization layer 114.

Figure 3:
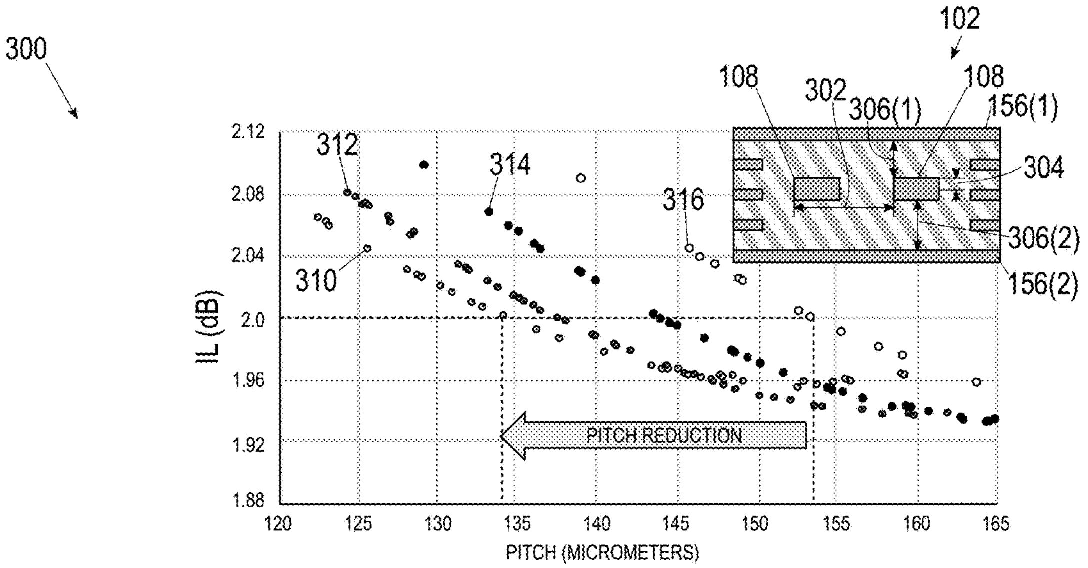
FIG. 3 is a schematic chart of insertion loss with pitch for different embodiments of an example microelectronic assembly.

FIG. 3 is a schematic chart of insertion loss with pitch for different embodiments of an example microelectronic assembly 100. The analysis results depicted in the figure are for an embodiment of package substrate 102, a portion of which is shown in the inset. In a general sense, a pitch 302 of a differential pair of conductive traces 108 is a sum of the trace widths and trace spacing. Electrical characteristics of conductive trace 108 may depend on a thickness 304 of trench via 154 as well as pitch 302 between conductive traces 108 that make up a differential pair and a thickness 306 of dielectric material 110 between conductive trace 108 and ground plate 156. Differential pairs of conductive traces 108 with different trace widths and spacings may have the same impedance for a given number of dielectric layers 116, metallization layers 114, and dielectric material 110 in package substrate 102. For a given impedance, a wider trace may reduce loss, but at the expense of a higher pitch.

Embodiments of the present disclosure may permit other options to reduce loss and/or achieve higher pitch 302 for both symmetric and asymmetric skip layer architecture. In symmetric skip layer architecture, a thickness 306 of dielectric material 110 on either side of conductive trace 108 between ground plates 156(1) and 156(2), i.e., thicknesses 306(1) and 306(2) respectively, is the same; in asymmetric skip architecture, the dielectric material 110 is thicker on one side of conductive side 108 than on the other side (e.g., ground plates 156(1) is closer to conductive trace 108 than ground plate 156(2)). For example, thickness 306(1) may be less than 306(2). In such asymmetric skip layer architecture, closer ground plate 156(1) may limit loss performance of conductive trace 108.

An analysis may be conducted to compare various configurations in package substrate 102 for conductive trace 108 and electromagnetic shield 112. In the analysis, a differential pair of conductive traces 108 may be assumed with dimensions as provided in the table. Dielectric material 110, surface roughness models and target impedance may be assumed to be the same across the different configurations studied. The analysis would show that compared to a conductive trace implemented without trench via 154, conductive traces 108 with trench via 154 perform better: the pitch is reduced by approximately 25% for the same loss when conducting signals having a frequency greater than 10 GHz, and loss is reduced by approximately 14% for the same pitch.

| trench via presence in conductive trace | dielectric thickness above/below conductive trace (μm) | trace thickness (μm) | trace width/ spacing (μm) | pitch (μm) | loss at 56 GHz (dB) |
|---|---|---|---|---|---|
| trench via not present | 30/75 | 15 | 49/111 | 160 | 2.8 |
| trench via present | 30/30 | 60 | 9/111 | 120 | 2.8 |
| trench via present | 45/45 | 30 | 42/118 | 160 | 2.4 |

In the chart, dots labeled 310 represent insertion loss with varying pitch 302 for trench via thickness 304 of 15 micrometers; dots labeled 312 represent insertion loss with varying pitch 302 for trench via thickness 304 of 10 micrometers; dots labeled 314 represent insertion loss with varying pitch 302 for trench via thickness 304 of 5 micrometers; dots labeled 316 represent insertion loss with varying pitch 302 for trench via thickness 304 of 0 micrometers (i.e., no trench via 154). The dielectric layer thickness used in the analysis being 30 micrometers, it was found that trench via thickness 304 equal to half the dielectric layer thickness gave the best loss performance for the specific configuration analyzed. In embodiments with such configuration, trench via 154 may extend through at most half of a thickness of dielectric layer 116 in which trench via 154 is disposed.

In various embodiments, any of the features discussed with reference to any of FIGS. 1-3 herein may be combined with any other features to form a package with one or more IC dies as described herein, for example, to form a modified microelectronic assembly 100. Some such combinations are described above, but, in various embodiments, further combinations and modifications are possible.

EXAMPLE METHODS

Figure 4A:
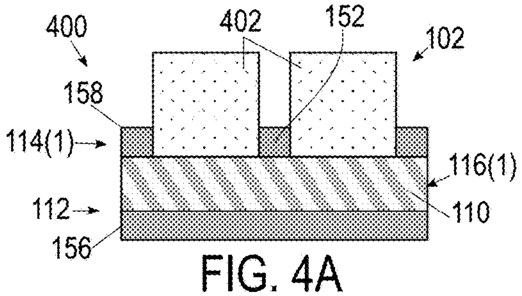
FIGS. 4A-4G are schematic cross-sectional views of a portion of yet another example microelectronic assembly during an example fabricating operation according to some embodiments of the present disclosure.

FIGS. 4A-4G are schematic cross-sectional views of a portion of yet another example microelectronic assembly during an example fabricating operation according to some embodiments of the present disclosure. FIG. 4A shows an assembly 400 subsequent to certain operations on package substrate 102. Package substrate 102 may be provided comprising ground plate 156. Dielectric material 110 may be deposited over ground plate 156 to form first dielectric layer 116(1). In various embodiments, depositing dielectric material 110 may comprise depositing a liquid form of dielectric material 110 and then curing it suitably (e.g., using heat or ultraviolet light). In other embodiments, depositing dielectric material 110 may comprise laminating a dry film to conform to various surfaces appropriately.

First metallization layer 114(1) may be formed over first dielectric layer 116(1) using photolithography and electroplating. A photoresist material 402 may be deposited over first dielectric layer 116, and then patterned according to a layout of ground traces 158 of electromagnetic shield 112 and metal plate 152 of conductive trace 108. Conductive material (e.g., metal such as copper, etc.) may be electroplated in the trenches created during the photolithography operation to form ground traces 158 and metal plate 152 having desired dimensions. At the end of the operation, first metallization layer 114(1) may comprise conductive plates (e.g., 158, 152) separated from each other. A subset of the deposited conductive plates may correspond to conductive trace 108.

Figure 4B:
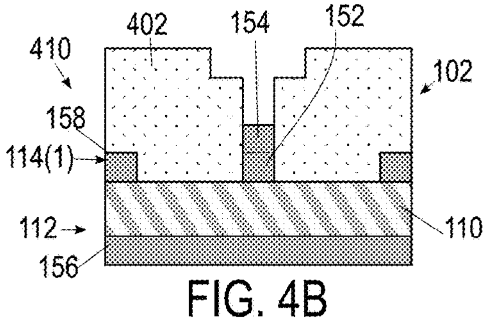

FIG. 4B shows an assembly 410 subsequent to certain further operations on package substrate 102. Additional photoresist material 402 may be deposited over the subset of conductive plates patterned according to conductive trace 108 to form trench via 154 in contact with metal plate 152. Trench via 154 may be patterned to extend through the length of conductive trace 154.

Figure 4C:
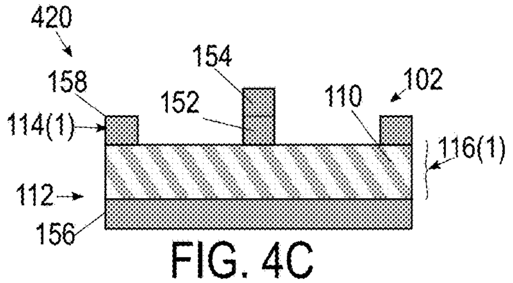

FIG. 4C shows an assembly 420 subsequent to certain further operations on package substrate 102. Photoresist material 402 may be removed to expose conductive plates comprising ground traces 158 and metal plate 152 and trench via 154 over metal plate 152.

Figure 4D:
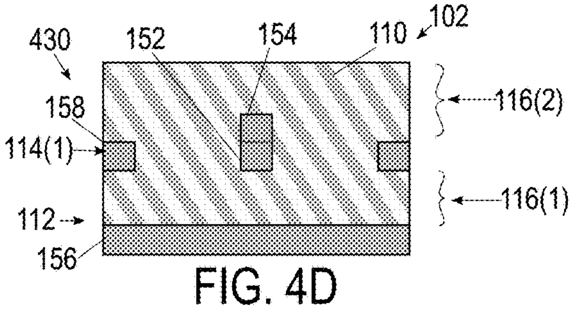

FIG. 4D shows an assembly 430 subsequent to certain further operations on package substrate 102. Dielectric material 110 may be deposited around the conductive plates of first metallization layer 114(1) and over first metallization layer 114(1) around trench via 154 to form a second dielectric layer 116(2). In various embodiments, the amount of dielectric material 110 may be such that it exceeds the thickness of trench via 154.

Figure 4E:
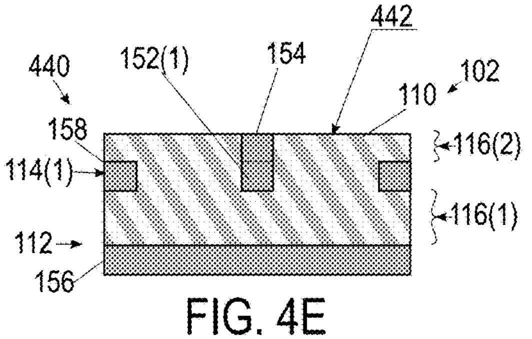

FIG. 4E shows an assembly 440 subsequent to certain further operations on package substrate 102. A surface 442 of second dielectric layer 116(2) is planarized such that a surface of trench via 154 is visible through second dielectric layer 116(2).

Figure 4F:
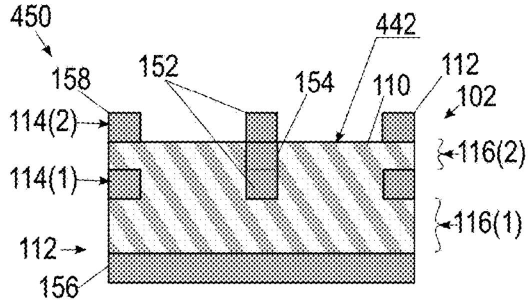

FIG. 4F shows an assembly 450 subsequent to certain further operations on package substrate 102. In some embodiments (not shown) after planarizing surface 442 of second dielectric layer 116(2), additional dielectric material 110 may be added such that thickness variation of the additional dielectric material 110 over trench via 154 can be controlled. In other embodiments (as shown) a second metallization layer 114(2) may be formed directly over planarized surface 442 of second dielectric layer 116(2) using photolithography and electroplating as described for first metallization layer 114(1) in reference to FIG. 4A. Second metallization layer 114(2) comprises second conductive plates separated from each other. In some embodiments (not shown), the second conductive plates are not aligned with trench via 154. In other embodiments (as shown) a subset of the second conductive plates corresponding to metal plate 152 of conductive trace 108 are aligned and in contact with trench via 154.

Figure 4G:
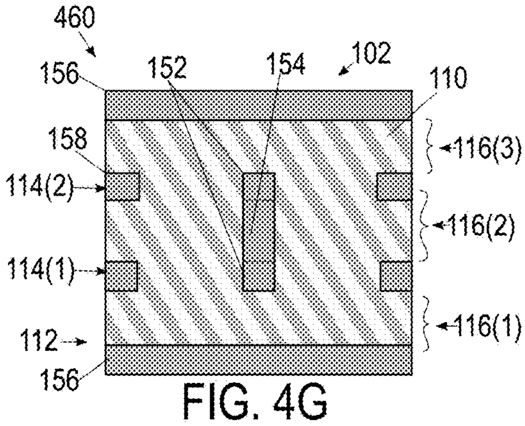

FIG. 4G shows an assembly 460 subsequent to certain further operations on package substrate 102. Dielectric material 110 may be deposited over second metallization layer 114(2) to create a third dielectric layer 116(3). A second ground plate 156 may be formed over third dielectric layer 116(3) to complete package substrate 102. In various embodiments, the operations described in reference to FIGS. 4A-4F may be repeated any number of times to build package substrate 102 comprising many metallization layers 114 and dielectric layers 116.

FIGS. 5A-5H are schematic cross-sectional views of a portion of yet another example microelectronic assembly 100 during an example fabricating operation according to some embodiments of the present disclosure. In some embodiments, trench via 154 may be formed using litho-via (LIV) process with different lithography masks in different processing steps. In such embodiments, the misalignment between different lithography masks can cause lateral misalignment (e.g., up to 5 micrometers) in a spacing between conductive trace 108 and lateral ground traces 158 so that conductive trace 108 is not centered between ground traces 158 in any one metallization layer 114.

Figure 5A:
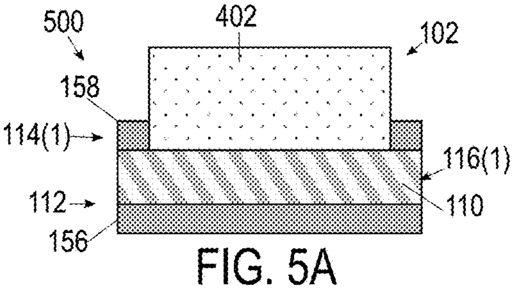
FIGS. 5A-5H are schematic cross-sectional views of a portion of yet another example microelectronic assembly during an example fabricating operation according to some embodiments of the present disclosure.

FIG. 5A shows an assembly 500 subsequent to certain operations on package substrate 102. Package substrate 102 may be provided comprising ground plate 156. Dielectric material 110 may be deposited over ground plate 156 to form first dielectric layer 116(1). In various embodiments, depositing dielectric material 110 may comprise depositing a liquid form of dielectric material 110 and then curing it suitably (e.g., using heat or ultraviolet light). In other embodiments, depositing dielectric material 110 may comprise laminating a dry film to conform to various surfaces appropriately.

First metallization layer 114(1) may be formed over first dielectric layer 116(1) using photolithography and electroplating. A photoresist material 402 may be deposited over first dielectric layer 116, and then patterned according to a layout of ground traces 158 of electromagnetic shield 112. Conductive material (e.g., metal such as copper, etc.) may be electroplated in the trenches created during the photolithography operation to form ground traces 158 having desired dimensions. At the end of the operation, first metallization layer 114(1) may comprise ground traces 158 separated from each other.

Figure 5B:
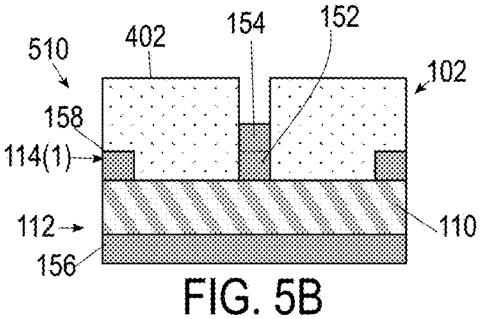

FIG. 5B shows an assembly 510 subsequent to patterning conductive trace 108 comprising metal plate 152 and trench via 154 in metallization layer 114(1) and dielectric layer 116(2) respectively. Photoresist 402 may be applied on assembly 500 and patterned according to the contours of conductive trace 108. Conductive material may be deposited appropriately to form conductive trace 108.

Figure 5C:
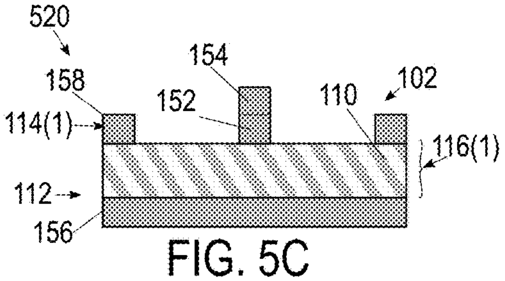

FIG. 5C shows an assembly 520 subsequent to certain further operations on package substrate 102. Photoresist material 402 may be removed to expose conductive plates comprising ground traces 158, metal plate 152 and trench via 154 over metal plate 152.

Figure 5D:
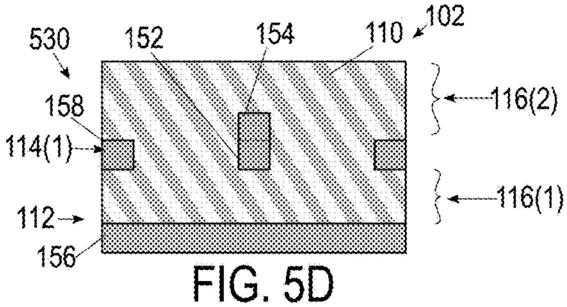

FIG. 5D shows an assembly 530 subsequent to certain further operations on package substrate 102. Dielectric material 110 may be deposited around the conductive plates of first metallization layer 114(1) and over first metallization layer 114(1) around trench via 154 to form a second dielectric layer 116(2). In various embodiments, the amount of dielectric material 110 may be such that it exceeds the thickness of trench via 154.

Figure 5E:
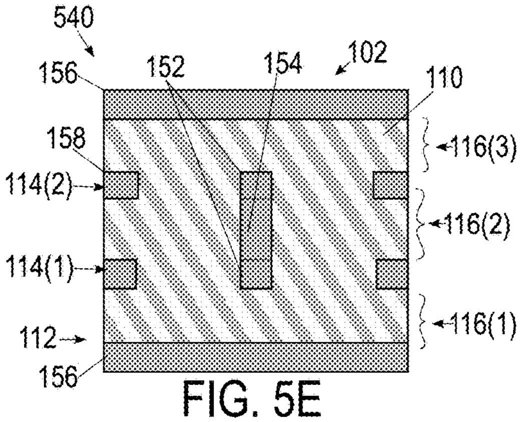

FIG. 5E shows an assembly 540 subsequent to certain further operations on package substrate 102. Second metallization layer 114(2) may be created over dielectric layer 116(2). Subsequently, dielectric material 110 may be deposited over second metallization layer 114(2) to create a third dielectric layer 116(3). A second ground plate 156 may be formed over third dielectric layer 116(3) to complete package substrate 102. In various embodiments, the operations described in reference to FIGS. 5A-5C may be repeated any number of times to build package substrate 102 comprising many more metallization layers 114 and dielectric layers 116.

Figure 5F:
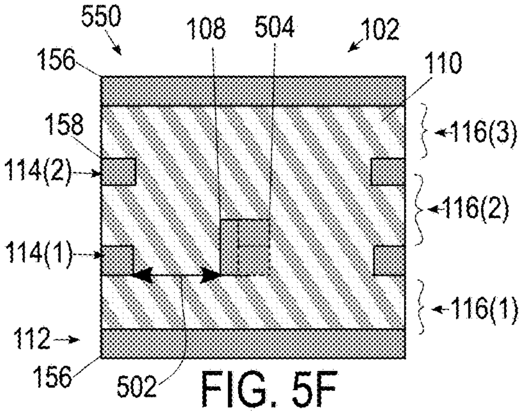

FIG. 5F shows an assembly 550 resulting from misalignment in the operation described by FIG. 5B. During this operation, misalignment in spacing 502 of conductive trace 108 relative to ground traces 158 may occur if the mask used to make trenches corresponding to conductive trace 108 is misaligned with respect to the mask used to make ground traces 158 (e.g., used in the operation described in FIG. 5A). The result may be that conductive trace 108 is not centered between ground traces 158 in metallization layer 114(1). Note that metallization layer 114(1) is shown here merely as an example, and not as a limitation. Misalignment between masks used to pattern photoresist in the same layer in different operations may occur in any metallization layer 114 and/or dielectric layer 116 within the broad scope of the embodiments. Such misalignment may be taken into account suitably during the design phase of package substrate 102 in some embodiments when tolerances, etc. are specified.

Figure 5G:
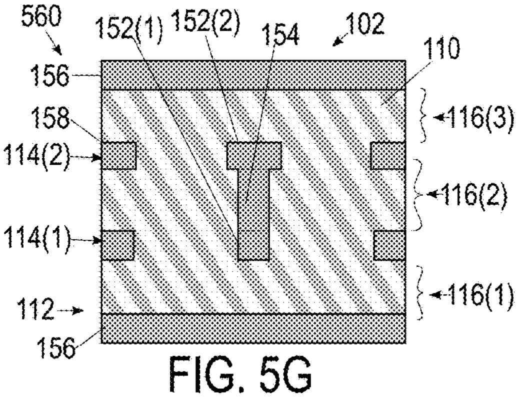

FIG. 5G shows an assembly 560 in which misalignment in metallization layer 114(1) is taken into account by suitable tolerances for metal plate 152(2) in subsequently deposited metallization layer 114(2). Thus, metal plate 152(2) may be provided with an additional tolerance of approximately 5 micrometers on either side corresponding to the expected misalignment in spacing 502.

Figure 5H:
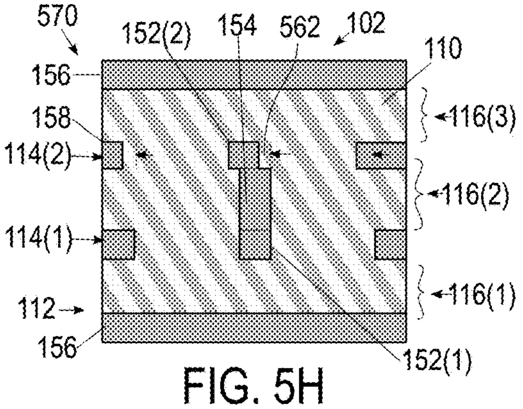

FIG. 5H shows an assembly 570 in which misalignment in metallization layer 114(1) is not taken into account during the design phase, for example, and metallization layer 114(2) as a whole may be misaligned from metallization layer 114(1). As a result, metal plate 152(2) as also ground traces 158 in metallization layer 114(2) may be shifted by a distance 562 corresponding to the misalignment. In such embodiments, metal pad 152(2) may not fully overlap with trench via 154. In various embodiments, such misalignment may not exceed 5 micrometers.

Figure 6A:
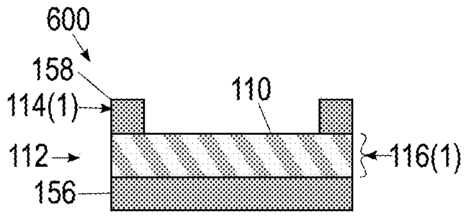
FIGS. 6A-6G are schematic cross-sectional views of a portion of yet another example microelectronic assembly during an example fabricating operation according to some embodiments of the present disclosure.

FIGS. 6A-6G are schematic cross-sectional views of a portion of yet another example microelectronic assembly during an example fabricating operation according to some embodiments of the present disclosure. FIG. 6A shows an assembly 600 subsequent to certain operations on package substrate 102. Package substrate 102 may be provided comprising ground plate 156. Dielectric material 110 may be deposited over ground plate 156 to form first dielectric layer 116(1). In various embodiments, depositing dielectric material 110 may comprise depositing a liquid form of dielectric material 110 and then curing it suitably (e.g., using heat or ultraviolet light). In other embodiments, depositing dielectric material 110 may comprise laminating a dry film to conform to various surfaces appropriately. First metallization layer 114(1) may be formed over first dielectric layer 116(1) using photolithography and electroplating as described in reference to FIG. 4A.

Figure 6B:
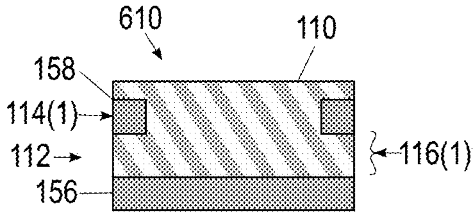

FIG. 6B shows an assembly 610 subsequent to certain further operations on package substrate 102. Dielectric material 110 may be deposited around and over the conductive plates of first metallization layer 114(1).

Figure 6C:
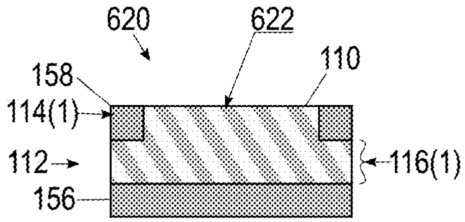

FIG. 6C shows an assembly 620 subsequent to certain further operations on package substrate 102. A surface 622 of the deposited dielectric material 110 may be planarized such that surfaces of the conductive plates of first metallization layer 114(1) are visible.

Figure 6D:
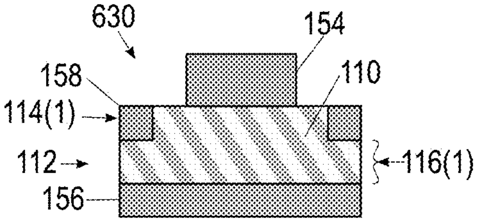

FIG. 6D shows an assembly 630 subsequent to certain further operations on package substrate 102. Conductive material (e.g., metal such as copper) may be deposited over planarized surface 622 to form trench via 154 over first metallization layer 114(1) at a location and according to a pattern corresponding to conductive trace 108. Trench via 154 may not contact any conductive plates of first metallization layer 114(1) in some embodiments (as shown).

Figure 6E:
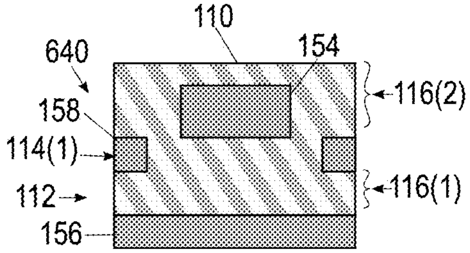

FIG. 6E shows an assembly 640 subsequent to certain further operations on package substrate 102. Additional dielectric material 110 may be deposited around and over trench via 154 to form second dielectric layer 116(2). The amount of deposited dielectric material 110 may be controlled so that a thickness of second dielectric layer 116(2) may be within a certain range for a desired loss performance (e.g., trench via thickness not to exceed half the thickness of the dielectric layer).

Figure 6F:
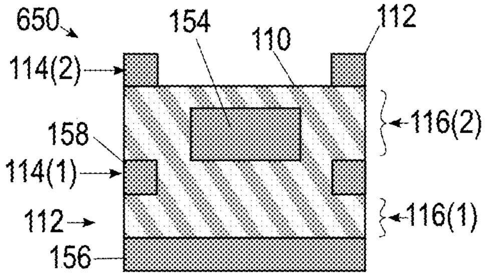

FIG. 6F shows an assembly 650 subsequent to certain further operations on package substrate 102. Second metallization layer 114(2) may be formed over second dielectric layer 116(2) using photolithography and electroplating as described for first metallization layer 114(1) in reference to FIG. 4A.

Figure 6G:
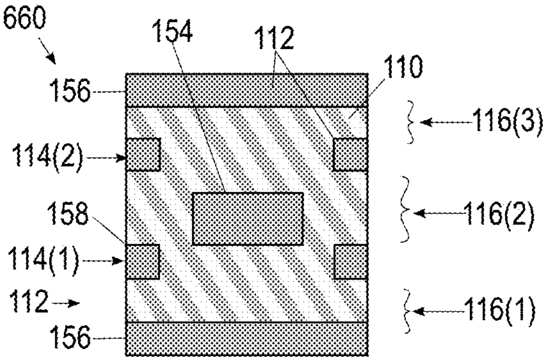

FIG. 6G shows an assembly 660 subsequent to certain further operations on package substrate 102. Dielectric material 110 may be deposited over second metallization layer 114(2) to create a third dielectric layer 116(3). A second ground plate 156 may be formed over third dielectric layer 116(3) to complete package substrate 102. In various embodiments, the operations described in reference to FIGS. 4A-4F may be combined with operations described in reference to FIGS. 6A-6F and repeated any number of times to build package substrate 102 comprising many metallization layers 114 and dielectric layers 116.

Although FIGS. 4-6 illustrates various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIGS. 4-6 may be modified in accordance with the present disclosure to fabricate others of microelectronic package 100 disclosed herein. Although various operations are illustrated in FIG. 5 once each, the operations may be repeated as often as desired. For example, one or more operations may be performed in parallel to manufacture and test multiple microelectronic packages substantially simultaneously. In another example, the operations may be performed in a different order to reflect the structure of a particular microelectronic package in which one or more substrates or other components as described herein may be included.

Furthermore, the operations illustrated in FIGS. 4-6 may be combined or may include more details than described. Still further, the various operations shown and described may further include other manufacturing operations related to fabrication of other components of the microelectronic assemblies described herein, or any devices that may include the microelectronic assemblies as described herein. For example, the operations not shown in FIGS. 4-6 may include various cleaning operations, additional surface planarization operations, operations for surface roughening, operations to include barrier and/or adhesion layers as desired, and/or operations for incorporating microelectronic packages as described herein in, or with, an IC component, a computing device, or any desired structure or device.

EXAMPLE DEVICES AND COMPONENTS

Figure 7:
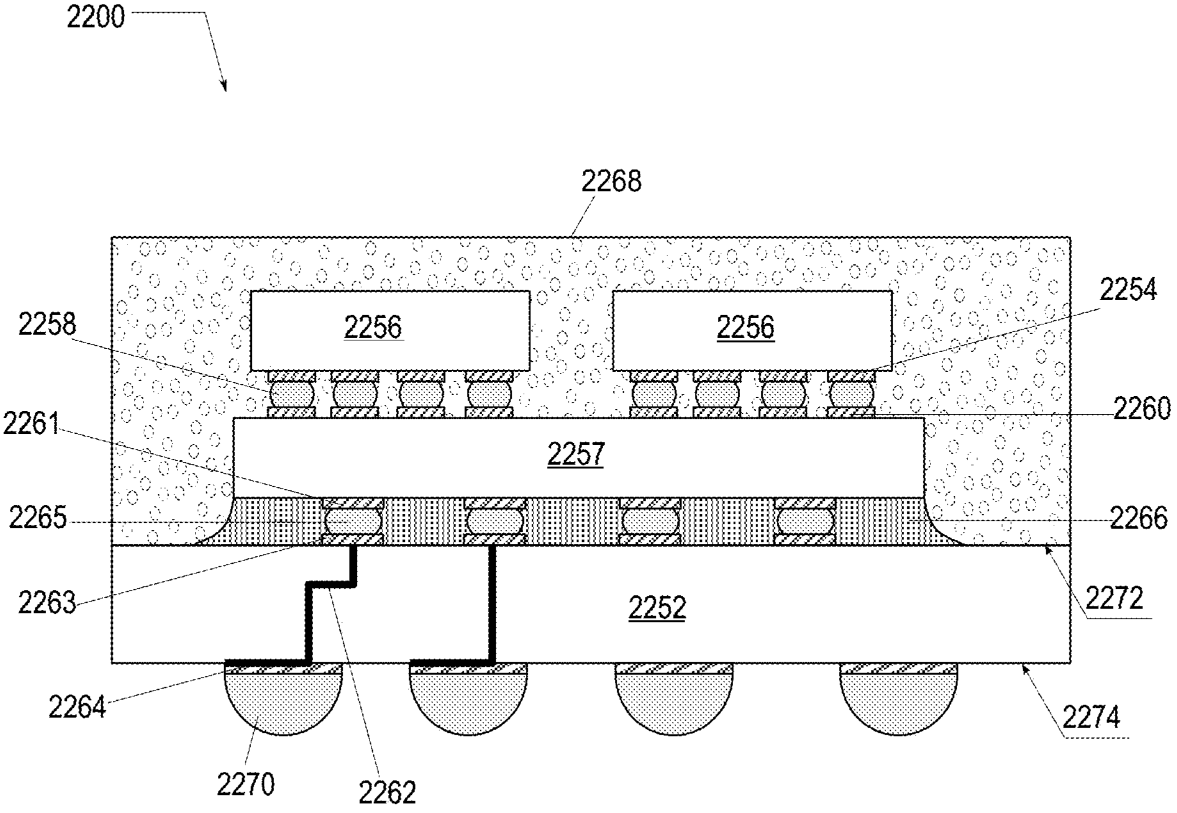
FIG. 7 is a cross-sectional view of a device package that includes one or more microelectronic assemblies in accordance with any of the embodiments disclosed herein.
Figure 8:
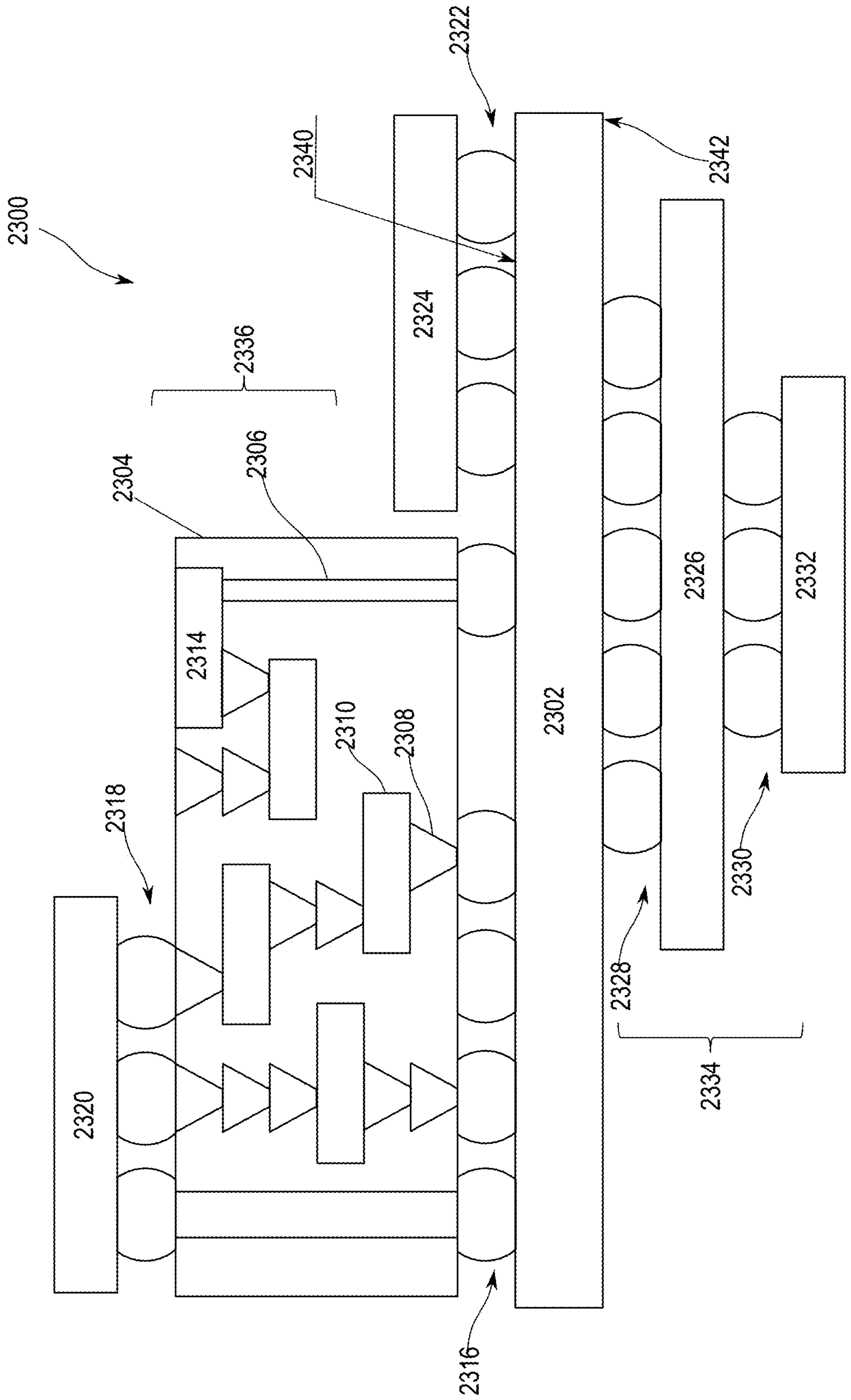
FIG. 8 is a cross-sectional side view of a device assembly that includes one or more microelectronic assemblies in accordance with any of the embodiments disclosed herein.
Figure 9:
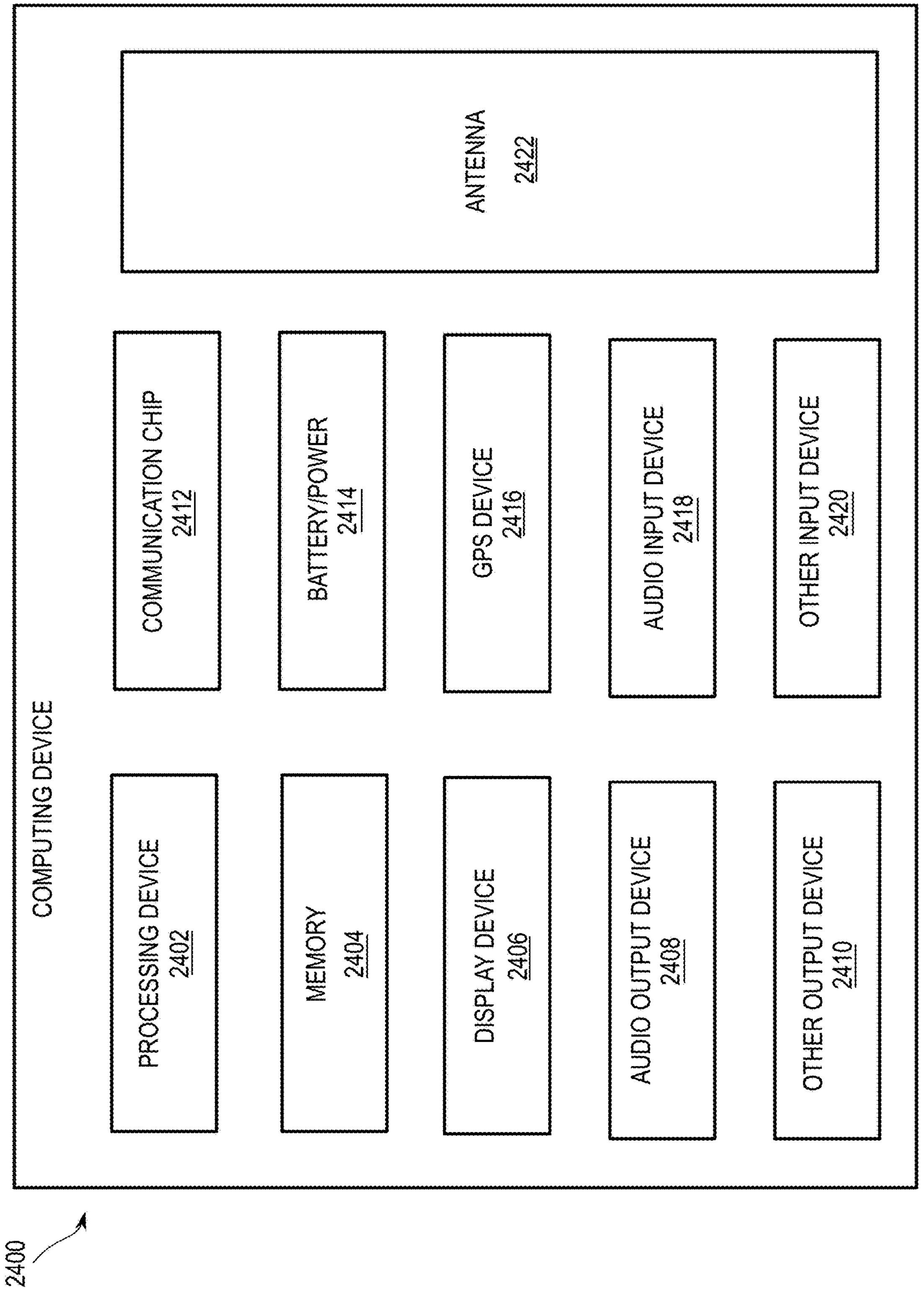
FIG. 9 is a block diagram of an example computing device that includes one or more microelectronic assemblies in accordance with any of the embodiments disclosed herein.

The packages disclosed herein, e.g., any of the embodiments shown in FIGS. 1-6 or any further embodiments described herein, may be included in any suitable electronic component. FIGS. 7-9 illustrate various examples of packages, assemblies, and devices that may be used with or include any of the IC packages as disclosed herein.

FIG. 7 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 8.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 8 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 7.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 7. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 9 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 7). In yet another example, any one or more of the components of computing device 2400 may include an IC device assembly 2300 (e.g., as shown in FIG. 8).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-chip (SOC) die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

The following paragraphs provide various examples of the embodiments disclosed herein.

Example 1 provides a microelectronic assembly (e.g., 100), comprising (e.g., FIG. 1A): a package substrate (e.g., 102) comprising a conductive trace (e.g., 108) in a dielectric material (e.g., 110), the conductive trace surrounded by a conductive structure (e.g., electromagnetic shield 112) coupled to a ground connection, the package substrate further comprising metallization layers (e.g., 114) alternating with dielectric layers (e.g., 116) of the dielectric material; and an integrated circuit (IC) die (e.g., 118) coupled to a surface (e.g., 104) of the package substrate, the IC die coupled to the conductive trace by a conductive pathway (e.g., 122), in which: the dielectric layers and the metallization layers are parallel to the surface of the package substrate, the conductive trace comprises a trench via (e.g., 154) in at least one dielectric layer, and the conductive structure comprises grounded plates (e.g., 156) extending across a length and width of the package substrate in the metallization layers (e.g., 114(1), 114(5)) on either side of the conductive trace.

Example 2 provides the microelectronic assembly of example 1, in which the conductive structure further comprises grounded traces (e.g., 158) in the metallization layers between the grounded plates.

Example 3 provides the microelectronic assembly of example 2, in which (e.g., FIG. 5): the trench via is between a first grounded trace and a second grounded trace in one of the metallization layers, a first distance of the trench via from the first grounded trace is different from a second distance of the trench via from the second grounded trace.

Example 4 provides the microelectronic assembly of any one of examples 1-3, in which (e.g., FIG. 3): the trench via has a first side and an opposing second side, the dielectric material has a first thickness (e.g., 306(1)) between the first side of the trench via and one of the grounded plates (e.g., 156(1)), the dielectric material has a second thickness (e.g., 306(2)) between the second side of the trench via and the other of the grounded plates (e.g., 156(2)), and the first thickness is less than the second thickness.

Example 5 provides the microelectronic assembly of any one of examples 1-4, in which (e.g., FIG. 2): the trench via has a first side and an opposing second side, the conductive trace further comprises a metal plate (e.g., 152) in one of the metallization layers, the metal plate is between grounded traces in the one of the metallization layers, and the first side of the trench via is in continuous contact with the metal plate along a length of the conductive trace.

Example 6 provides the microelectronic assembly of example 5, in which (e.g., FIG. 1C): the conductive trace comprises another trench via (e.g., 154(2)) in another dielectric layer (e.g., 116(3)) on a side of the metal plate opposite to the trench via, and the another trench via is in continuous contact with the metal plate along the length of the conductive trace.

Example 7 provides the microelectronic assembly of example 5, in which (e.g., FIG. 1B): the metal plate is a first metal plate (e.g., 152(1)), the one of the metallization layers is a first metallization layer, the conductive trace further comprises a second metal plate (e.g., 152(2)) in a second metallization layer (e.g., 114(2)) on the second side of the trench via, the second side of the trench via is in continuous contact with the second metal plate along the length of the conductive trace.

Example 8 provides the microelectronic assembly of example 7, in which: the metal plate has a first width, the second plate has a second width, the first width is not greater than the second width.

Example 9 provides the microelectronic assembly of any one of examples 5-8, in which: the metal plate has a first width, the trench via has a second width, the first width is not greater than the second width.

Example 10 provides the microelectronic assembly of any one of examples 1-6 or 9, in which (e.g., FIG. 3) the trench via extends through at most half of a thickness of the at least one dielectric layer.

Example 11 provides the microelectronic assembly of any one of examples 1-10 (e.g., FIG. 1B), in which the conductive trace comprises a plurality of parallel metal plates in adjacent metallization layers and trench vias in the dielectric layers between the adjacent metallization layers, the trench vias in continuous contact with adjacent metal plates along a length of the conductive trace.

Example 12 provides the microelectronic assembly of any one of examples 1-11, in which the conductive trace is parallel to the surface of the package substrate.

Example 13 provides the microelectronic assembly of any one of examples 1-12, in which: the conductive trace is a first conductive trace, and the microelectronic assembly further comprises a second conductive trace parallel to and coplanar with the first conductive trace.

Example 14 provides the microelectronic assembly of example 13, in which: the first conductive trace and the second conductive trace form a first pair of conductive traces having a first pitch (e.g., 302), another microelectronic assembly comprises a second pair of conductive traces having a second pitch, the second pair of conductive traces comprising metal plates without trench vias, and having a greater thickness of dielectric material between the conductive traces and one of the grounded plates than between the conductive traces and the other of the grounded plates, the first pitch is smaller than the second pitch such that the first pair of conductive traces and the second pair of conductive traces are configured to have a same loss when conducting signals having speeds greater than 10 GHz.

Example 15 provides the microelectronic assembly of example 13, in which: the first conductive trace and the second conductive trace form a first pair of conductive traces having a first pitch (e.g., 302), another microelectronic assembly comprises a second pair of conductive traces having a second pitch, the second pair of conductive traces comprising metal plates without trench vias, and having a greater thickness of the dielectric material between the conductive traces and one of the grounded plates than between the conductive traces and the other of the grounded plates, the first pitch is equal to the second pitch such that the first pair of conductive traces is configured to have a first loss and the second pair of conductive traces is configured to have a second loss when conducting signals having speeds greater than 10 GHz, and the second loss is greater than the first loss.

Example 16 provides a package substrate (e.g., 102), comprising: a first ground plate (e.g., 112) and a second ground plate coupled to a ground connection; a dielectric layer between the first ground plate and the second ground plate; and a conductive trace comprising a trench via in the dielectric layer, the trench via not in contact with the first ground plate or the second ground plate, in which: the dielectric layer comprises a dielectric material, and the trench via is parallel to the first ground plate and the second ground plate.

Example 17 provides the package substrate of example 16, further comprising a plurality of metallization layers between the first ground plate and the second ground plate, in which: adjacent metallization layers are separated by the dielectric material, each metallization layer comprises at least two ground traces coupled to the ground connection, the at least two ground traces are separated by the dielectric material within the metallization layer, and the conductive trace is laterally between the at least two ground traces.

Example 18 provides the package substrate of example 17, in which: the conductive trace further comprises at least one metal plate in one of the metallization layers, and the at least one metal plate is in contact with the trench via.

Example 19 provides the package substrate of example 18, in which: the at least one metal plate is a first metal plate, the one of the metallization layers is a first metallization layer, the conductive trace further comprises a second metal plate in a second metallization layer, and the second metal plate is in contact with the trench via on a side of the trench via opposite to the first metal plate.

Example 20 provides the package substrate of example 18, in which: the trench via is a first trench via, the dielectric layer is a first dielectric layer, the conductive trace comprises a second trench via in a second dielectric layer on a side of the metal plate opposite to the first trench via.

Example 21 provides the package substrate of example 17, in which the conductive trace comprises: a plurality of metal plates in the plurality of metallization layers; and a plurality of trench vias in the dielectric material between adjacent metallization layers, in which each trench vias is in the contact with at least one metal plate proximate to the respective trench via.

Example 22 provides the package substrate of any one of examples 17-21, in which the conductive trace extends across a plurality of dielectric layers and a subset of the plurality of metallization layers.

Example 23 provides the package substrate of any one of examples 16-22, further comprising another conductive trace parallel to and coplanar with the conductive trace, in which the another conductive trace is separated from the conductive trace by a trace spacing filled with the dielectric material.

Example 24 provides the package substrate of any one of examples 16-23, in which the package substrate is configured to be coupled to an IC die by die-to-package substrate (DTPS) interconnects (e.g., 120).

Example 25 provides the package substrate of example 24, in which a conductive pathway (e.g., 122) coupled to the conductive trace is configured to be conductively coupled to the IC die.

Example 26 provides a method (e.g., 1000) of fabricating a package substrate, the method comprising (e.g., FIGS. 4, 5, 6): providing a substrate comprising a first ground plate; depositing a dielectric material over the first ground plate to create a first dielectric layer; forming a first metallization layer over the first dielectric layer using photolithography, in which the first metallization layer comprises first conductive plates separated from each other; forming trench vias over the first metallization layer, in which the trench vias are patterned along lengths of respective conductive traces; depositing the dielectric material over the first metallization layer to create a second dielectric layer; forming a second metallization layer over the second dielectric layer using photolithography, in which the second metallization layer comprises second conductive plates separated from each other; depositing the dielectric material over the second metallization layer to create a third dielectric layer; and forming a second ground plate over the third dielectric layer.

Example 27 provides the method of example 26, in which depositing the dielectric material over the first metallization layer comprises depositing the dielectric material around the first conductive plates (e.g., FIG. 6B).

Example 28 provides the method of example 26, in which depositing the dielectric material over the first metallization layer comprises depositing the dielectric material around and over the trench vias (e.g., FIG. 4D, 6E).

Example 29 provides the method of example 26, in which (e.g., FIG. 4B): a subset of the first conductive plates is patterned according to respective conductive traces, and forming the trench vias comprises: after forming the first metallization layer and before creating the second dielectric layer, depositing a conductive material of the trench vias over the subset of the first conductive plates to form the trench vias in contact with the subset of the first conductive plates.

Example 30 provides the method of example 29, in which the second conductive plates are not aligned with the trench vias.

Example 31 provides the method of any one of examples 26-30,in which the second dielectric layer is thicker than the trench vias (e.g., FIG. 4D).

Example 32 provides the method of any one of examples 26-30, further comprising, before forming the second metallization layer: planarizing a surface of the second dielectric layer such that surfaces of the trench vias are visible through the second dielectric layer (e.g., FIG. 4E).

Example 33 provides the method of example 32, in which a subset of the second conductive plates is aligned and in contact with the trench vias.

Example 34 provides the method of example 32, in which after planarizing the surface of the second dielectric layer, additional dielectric material is added such that thickness variation of the additional dielectric material over the trench vias is controlled.

35 provides the method of any one of examples 26-27, in which forming the trench vias and depositing the dielectric material over the first metallization layer comprises: after forming the first metallization layer, depositing the dielectric material around the first conductive plates (e.g., FIG. 6B); planarizing a surface of the deposited dielectric material such that surfaces of the first conductive plates are visible (e.g., FIG. 6C); and depositing a conductive material of the trench vias over the dielectric material at locations corresponding to the trench vias (e.g., FIG. 6D).

Example 36 provides the method of example 36, in which the trench vias are not in contact with any of the first conductive plates.

Example 37 provides the method of example 35, in which: a subset of the first conductive plates is patterned according to the conductive traces, and the conductive material of the trench vias is deposited over the subset of the first conductive plates such that the trench vias are aligned with and in contact with the subset of the first conductive plates.

Example 38 provides the method of any one of examples 26-37, in which depositing the dielectric material comprises laminating a dry film comprising the dielectric material.

Example 39 provides the method of any one of examples 26-38, further comprising repeating forming the trench vias, depositing the dielectric material, and forming a metallization layer over the dielectric material until a desired structure of the package substrate is obtained.

Example 40 provides the method of any one of examples 26-39, in which forming the first metallization layer and the second metallization layer comprises electroplating conductive material.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
- a package substrate comprising:
  - a conductive trace in a dielectric material,
  - a conductive structure surrounding the conductive trace, wherein the conductive structure is coupled to a ground connection; and
  - metallization layers alternating with dielectric layers of the dielectric material; and
- an integrated circuit (IC) die coupled to a surface of the package substrate, the IC die coupled to the conductive trace by a conductive pathway, wherein:
  - the dielectric layers and the metallization layers are parallel to the surface of the package substrate,
  - the conductive trace comprises a trench via in at least one dielectric layer, and
  - the conductive structure comprises grounded plates extending across a length and width of the package substrate in the metallization layers on either side of the conductive trace.

2. The microelectronic assembly of claim 1, wherein the conductive structure further comprises grounded traces in the metallization layers between the grounded plates.

3. The microelectronic assembly of claim 1, wherein:
- the trench via has a first side and an opposing second side,
- the conductive trace further comprises a metal plate in one of the metallization layers,
- the metal plate is between grounded traces in the one of the metallization layers, and
- the first side of the trench via is in continuous contact with the metal plate along a length of the conductive trace.

4. The microelectronic assembly of claim 3, wherein:
- the conductive trace comprises another trench via in another dielectric layer on a side of the metal plate opposite to the trench via, and
- the another trench via is in continuous contact with the metal plate along the length of the conductive trace.

5. The microelectronic assembly of claim 3, wherein:
- the metal plate is a first metal plate,
- the one of the metallization layers is a first metallization layer,
- the conductive trace further comprises a second metal plate in a second metallization layer on the second side of the trench via, and
- the second side of the trench via is in continuous contact with the second metal plate along the length of the conductive trace.

6. The microelectronic assembly of claim 3, wherein:
- the metal plate has a first width,
- the trench via has a second width, and
- the first width is not greater than the second width.

7. The microelectronic assembly of claim 1, wherein the conductive trace comprises a plurality of parallel metal plates in adjacent metallization layers and trench vias in the dielectric layers between the adjacent metallization layers, the trench vias in continuous contact with adjacent metal plates along a length of the conductive trace.

8. The microelectronic assembly of claim 1, wherein:
- the conductive trace is a first conductive trace, and
- the microelectronic assembly further comprises a second conductive trace parallel to and coplanar with the first conductive trace.

9. A package substrate, comprising:
- a conductive structure comprising a first ground plate and a second ground plate coupled to a ground connection;
- a dielectric layer between the first ground plate and the second ground plate; and
- a conductive trace comprising a trench via in the dielectric layer, the trench via not in contact with the first ground plate or the second ground plate,
- wherein:
  - the conductive structure surrounds the conductive trace,
  - the dielectric layer comprises a dielectric material, and
  - the trench via is parallel to the first ground plate and the second ground plate.

10. The package substrate of claim 9, further comprising a plurality of metallization layers between the first ground plate and the second ground plate, wherein:
- adjacent metallization layers are separated by the dielectric material,
- each metallization layer comprises at least two ground traces coupled to the ground connection,
- the at least two ground traces are separated by the dielectric material within the metallization layer, and
- the conductive trace is laterally between the at least two ground traces.

11. The package substrate of claim 10, wherein:
- the conductive trace further comprises at least one metal plate in one of the metallization layers, and
- the at least one metal plate is in contact with the trench via.

12. The package substrate of claim 11, wherein:

the at least one metal plate is a first metal plate, the one of the metallization layers is a first metallization layer, the conductive trace further comprises a second metal plate in a second metallization layer, and the second metal plate is in contact with the trench via on a side of the trench via opposite to the first metal plate.

13. The package substrate of claim 11, wherein:

the trench via is a first trench via, the dielectric layer is a first dielectric layer, and the conductive trace comprises a second trench via in a second dielectric layer on a side of the metal plate opposite to the first trench via.

14. The package substrate of claim 10, wherein the conductive trace comprises:

a plurality of metal plates in the plurality of metallization layers; and a plurality of trench vias in the dielectric material between adjacent metallization layers, wherein each trench vias is in the contact with at least one metal plate proximate to the respective trench via.

15. The package substrate of claim 10, wherein the conductive trace extends across a plurality of dielectric layers and a subset of the plurality of metallization layers.

16. The package substrate of claim 9, further comprising another conductive trace parallel to and coplanar with the conductive trace, wherein the another conductive trace is separated from the conductive trace by a trace spacing filled with the dielectric material.

17. The package substrate of claim 9, further comprising a plurality of metallization layers between the first ground plate and the second ground plate, wherein the conductive structure further comprises grounded traces in the metallization layers between the grounded plates.

18. A microelectronic assembly comprising:

a package substrate having a surface, the package substrate comprising:

a plurality of dielectric layers;

a plurality of metallization layers alternating with the dielectric layers, wherein the dielectric layers and the metallization layers are parallel to the surface of the package substrate;

a conductive trace in the package substrate, the conductive trace comprising a trench via in one of the plurality of dielectric layers; and a conductive structure surrounding the conductive trace, the conductive structure comprises grounded plates extending across a length and width of the package substrate in the metallization layers on either side of the conductive trace, wherein the conductive structure is coupled to a ground connection; and an integrated circuit (IC) die coupled to the surface of the package substrate, the IC die coupled to the conductive trace by a conductive pathway.

19. The microelectronic assembly of claim 18, wherein the conductive structure further comprises grounded traces in the metallization layers between the grounded plates.

20. The microelectronic assembly of claim 19, wherein the trench via has a first side and an opposing second side, the conductive trace further comprises a metal plate in one of the plurality of metallization layers, the metal plate is between grounded traces in the one of the metallization layers, and the first side of the trench via is in contact with the metal plate along a length of the conductive trace.

* * * * *